(12) United States Patent
Masumoto et al.

(10) Patent No.: US 6,759,745 B2
(45) Date of Patent: Jul. 6, 2004

(54) SEMICONDUCTOR DEVICE AND MANUFACTURING METHOD THEREOF

(75) Inventors: Kenji Masumoto, Hayami-gun (JP); Mutsumi Masumoto, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/242,252

(22) Filed: Sep. 12, 2002

(65) Prior Publication Data

US 2003/0062613 A1 Apr. 3, 2003

(30) Foreign Application Priority Data

Sep. 13, 2001 (JP) ........................................ 2001-277480

(51) Int. Cl.[7] .............................................. H01L 23/04
(52) U.S. Cl. ...................... 257/730; 257/777; 257/786; 438/110
(58) Field of Search ................................ 257/777, 723, 257/724, 784, 686, 730; 438/109, 110

(56) References Cited

U.S. PATENT DOCUMENTS

| | | | | |
|---|---|---|---|---|
| 5,343,075 A | * | 8/1994 | Noshino | |
| 5,952,725 A | * | 9/1999 | Ball | |
| 6,049,124 A | * | 4/2000 | Raiser et al. | |
| 6,351,028 B1 | * | 2/2002 | Akram | |
| 6,576,992 B1 | * | 6/2003 | Cady et al. | |

* cited by examiner

Primary Examiner—S. V. Clark
(74) Attorney, Agent, or Firm—Yingsheng Tung; Wade James Brady, III; Frederick J. Telecky, Jr.

(57) ABSTRACT

A type of semiconductor device and its manufacturing method, which can further miniaturize semiconductor devices and reduce design restrictions by minimizing the fillet around the semiconductor chip. The semiconductor package is constituted by fixing semiconductor chip 100 on insulating substrate 102 via die paste 104. Semiconductor chip 100 has top surface 112, where an electronic circuit is formed, and a bottom surface 114 adhered to insulating substrate 102. The bottom surface 114 is formed smaller than top surface 112. By forming bottom surface 114 smaller than top surface 112, the amount of the fillet spread out around semiconductor chip 100 can be reduced.

22 Claims, 13 Drawing Sheets

SEMICONDUCTOR DEVICE AND MANUFACTURING METHOD THEREOF

FIELD OF THE INVENTION

The present invention pertains to a semiconductor device and its manufacturing method.

BACKGROUND OF THE INVENTION

In recent years, with the development of small highly-functional electronic information devices, various technologies have been developed in order to further miniaturize the semiconductor packages or other semiconductor devices loaded on these electronic information devices. CSP (chip size package) has such a high density that the size of the semiconductor package is equivalent to or a little larger than the chip size. Said CSP has high reliability and is easy to handle because it has such a structure that the semiconductor chip is covered with resin or other sealing material like the conventional semiconductor package.

FIG. 14 is a cross-sectional view illustrating the basic configuration of a general CSP type semiconductor package. In this semiconductor package, semiconductor chip 1400 with an integrated circuit formed on the top surface is fixed on insulating substrate 1402 via die paste 1404. Conductive leads 1406 are formed on the top surface of insulating substrate 1402 and are connected to solder bumps 1408 via through-holes formed in insulating substrate 1402. An electrode pad 1420 is formed on the main substrate of semiconductor chip 1400. Said electrode pad 1420 and conductive leads 1406 are connected to each other via conductive wires 1410 by means of wire bonding. Semiconductor chip 1400 is sealed with a sealing material 1418 made from a resin.

In the step of adhering semiconductor chip 1400 on insulating substrate 1402, a liquid die paste is provided to the surface of insulating substrate 1402, and semiconductor chip 1400 is pressed on the die paste to be adhered to the insulating substrate. In this case, die paste 1404 spreads out around semiconductor chip 1400 to form die paste accumulation called fillet F. In general, such spread-out of the die paste reaches a range about 200–300 $\mu$m around semiconductor chip 1400. Even when a film-like adhesive is used instead of the die paste (liquid), the film-like adhesive will be fluidized under pressure to form the same fillet. When a fillet F is present around semiconductor chip 1400, the bonding position B of conductive wire 1410 on conductive lead 1406 must be set relatively far away from semiconductor chip 1400 to avoid fillet F. This causes trouble in further miniaturizing the semiconductor package.

The existence of the fillet also becomes a problem in the semiconductor package with a stack structure formed by laminating multiple semiconductor chips. In the semiconductor package with the stack structure, the size of each laminated semiconductor chip is reduced as the stack is piled up in order to guarantee the region used for forming the electrode pad near the outer periphery of the top surface of each semiconductor chip. In the semiconductor package with the stack structure, however, when the semiconductor chip in the upper layer is adhered to the semiconductor chip in the lower layer, the adhesive layer spreads out of the area of the chip to form a fillet. Therefore, it is necessary to estimate the spread-out amount to determine the relative plane size of the semiconductor chip to be stacked. As a result, the plane size of the semiconductor chip in the upper layer cannot be much larger than the area of the semiconductor chip in the lower layer. This significantly restricts the package design.

Consequently, the first purpose of the present invention is to further miniaturize the semiconductor package by limiting the amount of the fillet spread out around the semiconductor chip to the minimum.

The second purpose of the present invention is to maximize the plane size of the semiconductor chip in the upper layer with respect to the semiconductor chip in the lower layer to be stacked by limiting the amount of the fillet spread out around the semiconductor chip to the minimum in the semiconductor package with a stack structure.

SUMMARY OF INVENTION

The semiconductor device of the present invention comprises an insulating substrate with a conductive lead formed on the top surface, a first semiconductor chip with a smaller bottom surface than top surface, which has an electronic circuit and an electrode pad formed on the top surface, is fixed via an adhesive to the top surface side of the aforementioned insulating substrate, a conductive wire that electrically connects the aforementioned conductive lead of the aforementioned insulating substrate to the aforementioned electrode pad of the first semiconductor chip, a sealing material that is arranged on the aforementioned insulating substrate to seal the aforementioned first semiconductor chip and the conductive wire, and an electrode used for external connection and formed on the bottom surface of the aforementioned insulating substrate opposite the top surface.

In the aforementioned structure, since the bottom surface of the first semiconductor chip is smaller than the top surface, the amount of the fillet spread out when the semiconductor chip is mounted on the insulating substrate is none or minimized with respect to the outer shape of the semiconductor chip (determined by the plane size of the top surface). Consequently, the bonding positions of the conductive wires can be guaranteed easily, and the semiconductor device can be further miniaturized.

The semiconductor device may also have a second semiconductor chip which has an electronic circuit and an electrode pad formed on the top surface and is directly fixed via an adhesive to the aforementioned top surface side of the aforementioned insulating substrate. The aforementioned second semiconductor chip can be directly fixed on the top surface of the first semiconductor chip via an adhesive.

In the semiconductor device with this structure, that is, the so-called stack structure, the plane size of the upper semiconductor chip with respect to the lower semiconductor chip to be stacked can be maximized by forming the upper semiconductor chip in such a way that its bottom surface is smaller than its top surface.

In this case, the bottom surface of the aforementioned second semiconductor chip is preferably smaller than its top surface.

In each of the aforementioned semiconductor devices, it is preferred that the edges of the aforementioned bottom surface of the aforementioned first semiconductor chip and/or second semiconductor chip form an outer peripheral end surface that slopes at a prescribed angle inwardly from each edge of the aforementioned top surface of the semiconductor chip, and the distance of the slope is in the range of 100–300 $\mu$m.

The inclination angle of the aforementioned outer peripheral end surface of the first and/or second semiconductor chip with respect to the aforementioned top surface is preferred to be in the range of 30–60°.

The semiconductor device of the present invention may also adopt such a structure that the outer peripheral end surface of the first and/or second semiconductor chip has a stepped shape instead of the aforementioned inclination.

The present invention also provides a semiconductor device manufacturing method. The semiconductor device manufacturing method provided by the present invention has the following steps: a step in which an electronic circuit and an electrode pad are formed on the top surface of a wafer used as a semiconductor substrate; a step in which the aforementioned wafer is cut in such a way that the aforementioned top surface is larger than the bottom surface for each semiconductor chip; a step in which an adhesive is provided to the top surface of an insulating substrate with a conductive lead formed on the top surface; a step in which the first semiconductor chip obtained as a result of cutting the aforementioned wafer is fixed to the top surface of the aforementioned insulating substrate via the aforementioned adhesive; a step in which the conductive lead on the aforementioned insulating substrate is connected to the electrode pad of the first semiconductor chip with a conductive wire; a step in which a resin is provided onto the aforementioned insulating substrate to seal the aforementioned first semiconductor chip; and a step in which an electrode for external connection is formed on the bottom surface of the aforementioned insulating substrate opposite the aforementioned top surface.

The aforementioned manufacturing method may also include a step in which a second semiconductor chip with an electronic circuit and an electrode pad formed on the top surface is prepared. In this case, the aforementioned step for fixing the first semiconductor chip to the top surface of the aforementioned insulating substrate via the aforementioned adhesive includes the following steps: a step in which the second semiconductor chip is directly fixed on the top surface of the aforementioned insulating substrate via an adhesive, and a step in which the first semiconductor chip is directly fixed on the top surface of the second semiconductor chip via an adhesive.

REFERENCE NUMERALS AS SHOWN IN THE DRAWINGS

In the figures, 100, 300, 500, 700 represent semiconductor chips, 102, 302, 502 represent insulating substrates, 104, 304, 504, 702 represent a die paste, 106, 306, 506 represent conductive leads, 110, 310, 510, 710 represent conductive wires, 112, 312, 512 represent a top surface, 114, 314, 514 represent a bottom surface, 120, 320, 520, 720 represent electrode pads, 116 represents an outer peripheral end surface, 316, 317, 516, 517 represents an end surface, 200, 400, 600 represents a wafer, and 204, 404, 405, 604, 605, 1034, 1305 represents blades.

DESCRIPTION OF THE EMBODIMENT

Figure 1A:
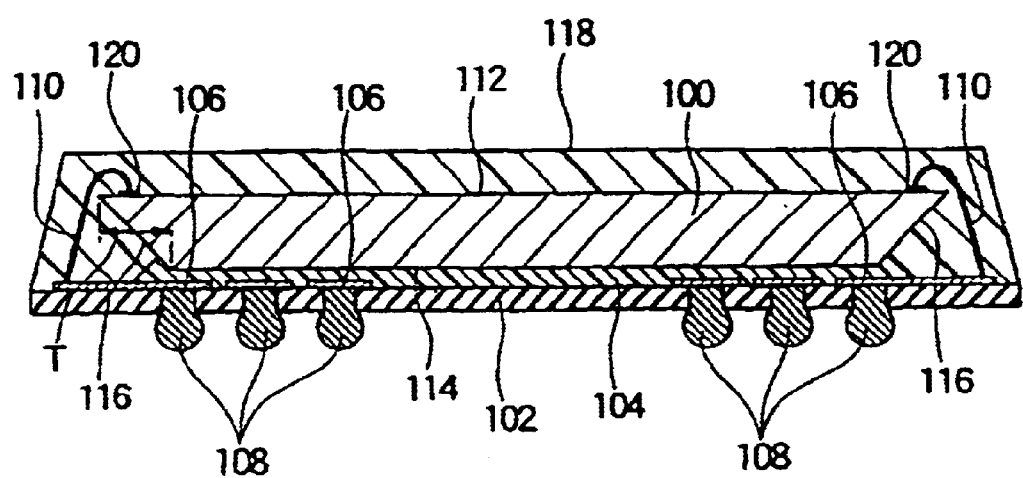
FIG. 1(A) is a cross-sectional side view illustrating the semiconductor package disclosed in the first embodiment of the present invention.

In the following, the present invention will be explained in more detail with reference to an embodiment shown in the figures. FIG. 1(A) is a cross-sectional view illustrating the basic structure of a semiconductor package as the semiconductor device disclosed in the first embodiment. In the semiconductor package disclosed in the present embodiment, semiconductor chip 100 is fixed on insulating substrate 102 via die paste 104 used as an adhesive. Semiconductor chip 100 has an integrated circuit (not shown in the figure) formed on the top surface (circuit surface 112) of a silicon substrate. It is adhered to insulating substrate 102 on the bottom surface (adhesion surface 114). Circuit surface 112 and adhesion surface 114 are formed parallel to each other. Die paste 104 is made of a thermoplastic polyimide, etc. Insulating substrate 102 is made of polyimide or a ceramic material. Conductive leads 106 made of copper are formed on its top surface (the surface on the side where semiconductor chip 100 is mounted). Conductive leads 106 are connected to solder bumps 108 used as the terminals for external connection via through-holes formed in insulating substrate 102. In desired embodiment, the thickness of semiconductor chip 100 is about 250–300 μm, while the thickness of insulating substrate 102 is about 50 μm. Also, the thickness of die paste 104 is about 20–50 μm.

Along the outer periphery of the circuit surface 112 of semiconductor chip 100, there are multiple (only two shown in FIG. 1) electrode pads 120 projecting out from the integrated circuit. The electrode pads 120 on the circuit surface 112 are connected to the conductive leads 106 on insulating substrate 102 by conductive wires 110 made of gold. Said semiconductor chip 100, insulating substrate 102, and conductive wires 110 are sealed with a resin material 118.

Figure 1B:
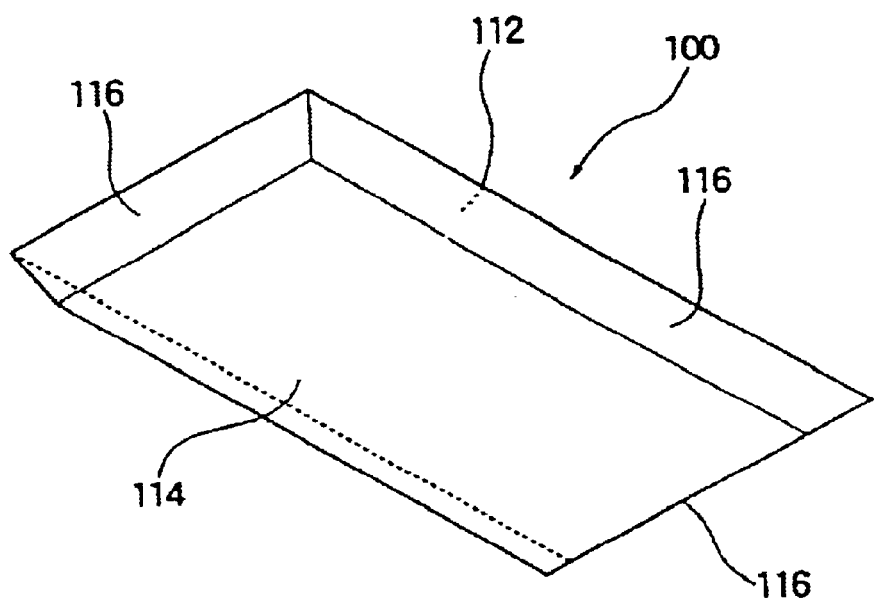
FIG. 1(B) is an oblique view illustrating a semiconductor chip.

FIG. 1(B) is the oblique view of semiconductor chip 100 viewed from the side of adhesion surface 114. Both the circuit surface 112 and adhesion surface 114 of semiconductor chip 100 have rectangular shapes. The area of adhesion surface 114 is a little smaller than that of circuit surface 112. The four edges of the adhesion surface 114 are located inwards compared with the four edges of the circuit surface 112, respectively. The outer peripheral end surface 116 of semiconductor chip 100 becomes an inclined tapered surface with respect to circuit surface 112 (and adhesion surface 114). The reason for this structure is to reduce or eliminate the amount of the die paste spread out around adhesion surface 114 outwards from circuit surface 112 during the step for adhering semiconductor chip 100 to insulating substrate 102. In a desired embodiment, each edge of the adhesion surface 114 is preferred to be located inwards 100–300 μm from each edge of the circuit surface 112. In this way, the die paste spread out around adhesion surface 114 is kept within the space on the underside of the circuit surface 112. Also, the inclination angle of the outer peripheral end surface 116 with respect to the circuit surface 112 is preferred to be in the range of 30–60°.

Figure 2A:
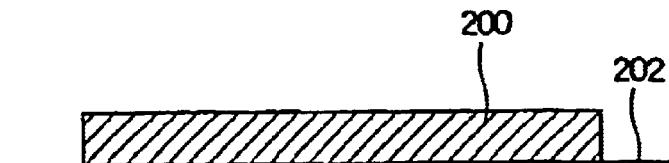
FIG. 2 is a diagram illustrating the process of manufacturing the semiconductor package shown in FIG. 1.

In the following, the manufacturing method of the semiconductor package disclosed in this embodiment will be explained with reference to FIGS. 2(A)–(E). First, an integrated circuit that constitutes a prescribed circuit pattern and the electrode pads (used for connection to conductive leads 106) protruding out from the integrated circuit are formed on the top surface 201 of wafer 200 made of silicon and used as a semiconductor substrate with the regular wafer process. Then, as shown in FIG. 2(A), wafer 200 is bonded to a first sheet 202 made of an adhesive resin from the side of its top surface 201.

Figure 2B:
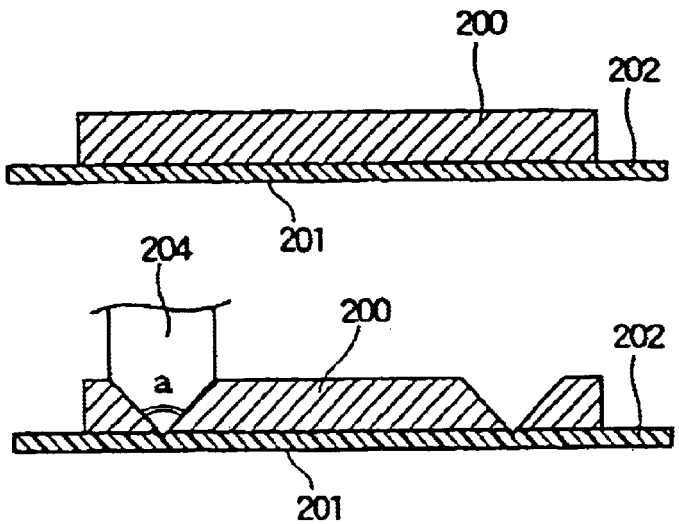

Then, as shown in FIG. 2(B), the wafer 200 supported by the first sheet 202 is cut off using a blade 204 for dicing. In a desired embodiment, a blade 204 with a blade width of 400 μm and the angle of the blade edge in the range of 60–120° C. is used to perform dicing from the side of wafer 200 opposite to the first sheet 202. The dicing operation is continued until blade 204 reaches the first sheet 202. In this way, multiple semiconductor chips 100 with outer peripheral end surface inclined at an angle of 30–60° can be cut from wafer 200. Also, grooved scribe lines indicating the dicing positions are formed in advance on the top surface 201 of wafer 200. Dicing of wafer 200 is conducted while the scribe lines are observed by an IR camera.

Figure 2C:
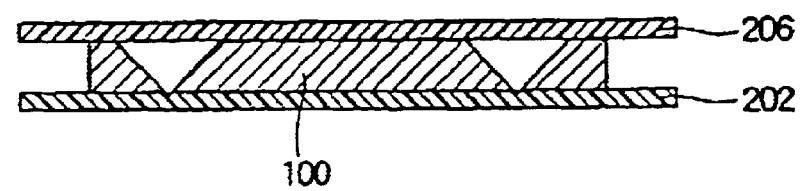
Figure 2D:
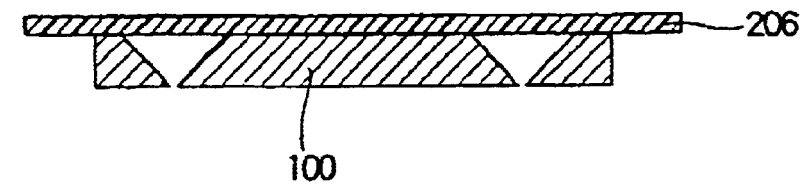
Figure 2E:
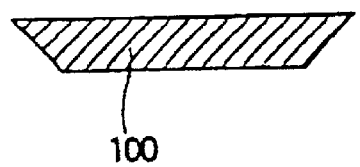

After cutting of wafer 200 is completed, the cut wafer 200 is washed. Then, the first sheet 202 is irradiated with UV light. As a result, the first sheet 202 is cured and the stickiness is removed. Then, as shown in FIG. 2(C), a second sheet 206 made of an adhesive resin is bonded to the side of wafer 200 opposite to the first sheet 202. After that, as shown in FIG. 2(D), the first sheet 202 is peeled off from wafer 200 while wafer 200 is supported by the second sheet 206. Then, after the second sheet 206 is irradiated with UV light to remove the stickiness, as shown in FIG. 2(E), each of semiconductor chips 100 is peeled off from the second sheet 206.

Each semiconductor chip 100 is adhered to insulating substrate 102 with die paste 104 as shown in FIG. 1. That is, after die paste 104 is provided to the top surface (the surface on the side of conductive leads 106) of insulating substrate 102 using a method called potting, semiconductor chip 100 is pressed against the die paste 104. In this way, semiconductor chip 100 is fixed on insulating substrate 102 via die paste 104. In this case, since the adhesion surface 114 of semiconductor chip 100 is smaller than circuit surface 112, even if the die paste spreads out around the adhesion surface 114, only a little will spread beyond circuit surface 112. Then, the electrode pads 120 on semiconductor chip 100 and the conductive leads 106 on insulating substrate 102 are connected to each other via conductive wires 110 by means of wire bonding. After that, a resin is provided onto insulating substrate 102 to form sealing material 118 to seal semiconductor chip 100. In this way, the semiconductor package shown in FIG. 1 is obtained.

As explained above, in the present embodiment, since the adhesion surface 114 of semiconductor chip 100 is smaller than the circuit surface 112, even if the die paste spreads out around the adhesion surface 114, only a little will spread beyond circuit surface 112. In this way, the bonding positions on the conductive leads 106 can be set closer to the outer periphery of semiconductor chip 100. Consequently, the semiconductor package can be further miniaturized. This will help to develop highly-integrated electronic information devices, etc.

In particular, since each edge of the adhesion surface 114 is located within 100–300 μm of each edge of the circuit surface 112, the die paste can be confined to the corresponding space so that the semiconductor package can be miniaturized. Also, since a taper is formed along the outer periphery of semiconductor chip 100, a structure with smaller adhesion surface 114 than circuit surface 112 can be obtained by a relatively simple processing.

Figure 3:
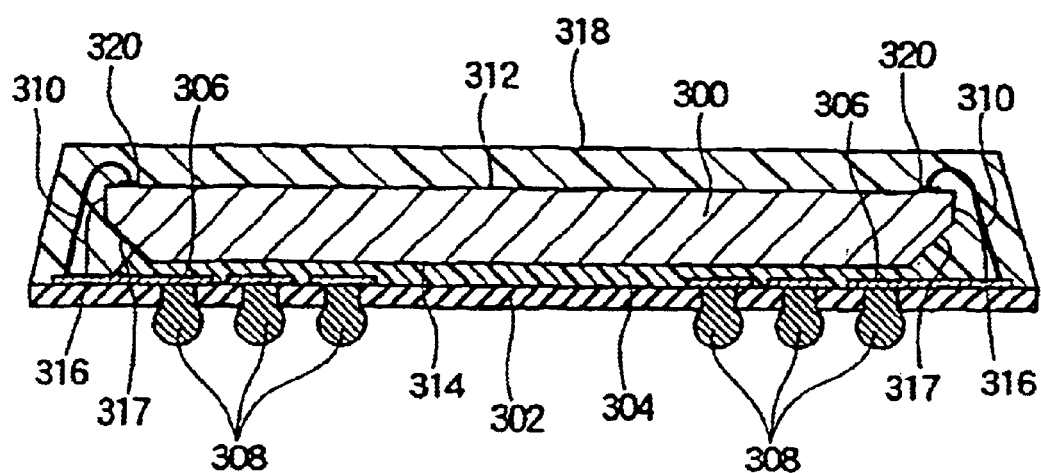
FIG. 3 is a cross-sectional side view illustrating the semiconductor package disclosed in the second embodiment of the present invention.
Figure 4A:
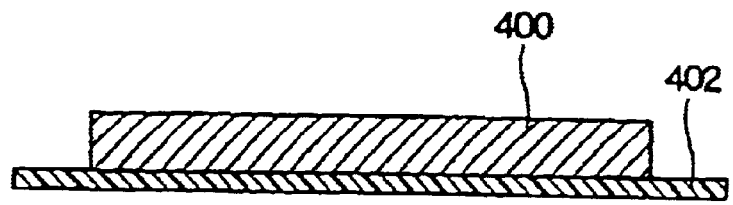
FIG. 4 is a diagram illustrating the process of manufacturing the semiconductor package shown in FIG. 3.
Figure 4B:
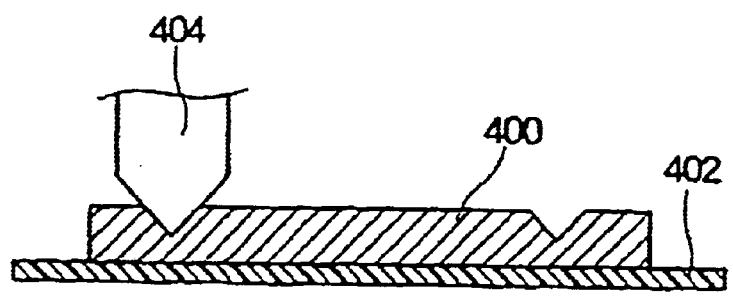
Figure 4C:
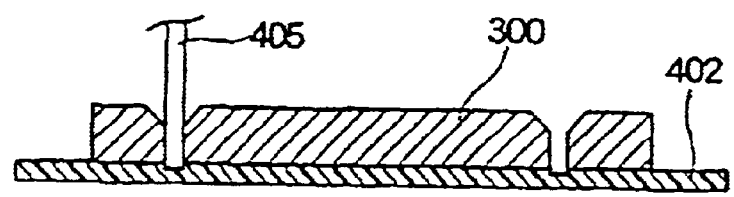
Figure 4D:
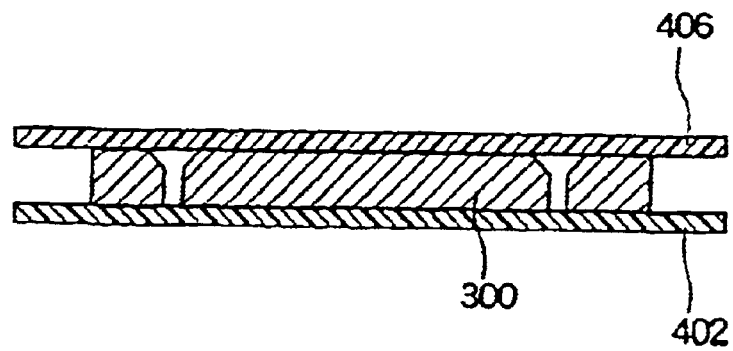
Figure 4E:
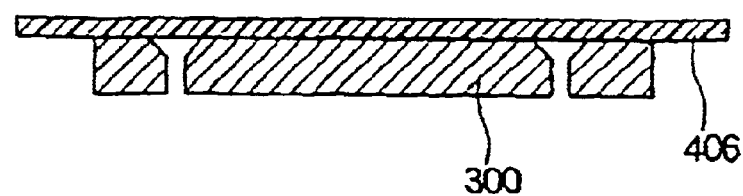
Figure 4F:
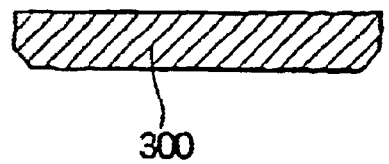

In the following, the second embodiment of the present invention will be explained. FIG. 3 shows the semiconductor device disclosed in the second embodiment. An integrated circuit (not shown in the figure) and electrode pads 320 are formed on the circuit surface 312 of semiconductor chip 300 in the same way as described in the first embodiment. Adhesion surface 314 is adhered to insulating substrate 302 via die paste 304. Also, semiconductor chip 300 is sealed by sealing material 318, and solder bumps 308 are formed on the bottom surface (the side opposite to semiconductor chip 300) of insulating substrate 302. Also, the adhesion surface 314 of semiconductor chip 300 is formed smaller than the circuit surface 312 in the same way as described in the first embodiment. However, the outer peripheral end surface 316 of semiconductor chip 300 is formed in such a way that the end surface 316 on the side of the circuit surface 312 becomes a vertical end surface, while the end surface 317 on the side of the adhesion surface 314 becomes a tapered surface. The material of each element is the same as that in the first embodiment.

FIG. 4 shows the method for manufacturing the semiconductor package disclosed in the second embodiment. First, the integrated circuit and the electrode pads are formed on the wafer surface 400 with the regular wafer process. As shown in FIG. 4(A), the wafer surface 400 where the integrated circuit is formed (bottom surface in the figure) is bonded to a first sheet 402 made of a resin. After that, wafer 400 is cut as shown in FIG. 4(B). In a desired embodiment, wafer 400 is diced from the side opposite the side of the first sheet 402 with a first blade 404 having a blade edge angle in the range of 60–120° and a blade width of 400 μm. The dicing operation performed with the first blade 404, however, is stopped halfway in the thickness direction of wafer 400. Then, as shown in FIG. 4(C), wafer 400 is cut completely (until semiconductor chips 300 are separated from each other) with a second blade 405 that is narrower than the first blade 404 and having the blade edge as a vertical end surface. Then, after the cut wafer 400 is washed, the first sheet 402 is irradiated with UV light in the way as described in the first embodiment to remove the stickiness. After a second sheet 406 made of another resin is bonded to the opposite side of wafer 400 against the first sheet 402 as shown in FIG. 4(D), the first sheet 402 is peeled off as shown in FIG. 4(E). Then, after the second sheet 406 is irradiated with UV light to remove the stickiness, the second sheet 406 is peeled off from each semiconductor chip 300 as shown in FIG. 4(F). The semiconductor chip 300 is adhered to insulating substrate 302 with die paste 304 as shown in FIG. 3. Also, the electrode pads 320 of semiconductor chip 300 and the conductive leads 306 on insulating substrate 302 are connected to each other by means of wire bonding (using conductive wires 310). In this way, the semiconductor package shown in FIG. 3 is obtained.

In this embodiment, since the adhesion surface 314 of semiconductor chip 300 is also smaller than the circuit surface 312, even if the die paste spreads out around the adhesion surface 314, only a little will spread beyond the semiconductor chip 300. In this way, the wire bonding positions on conductive leads 306 can be set closer to semiconductor chip 300, and the semiconductor package can be further miniaturized.

Figure 5:
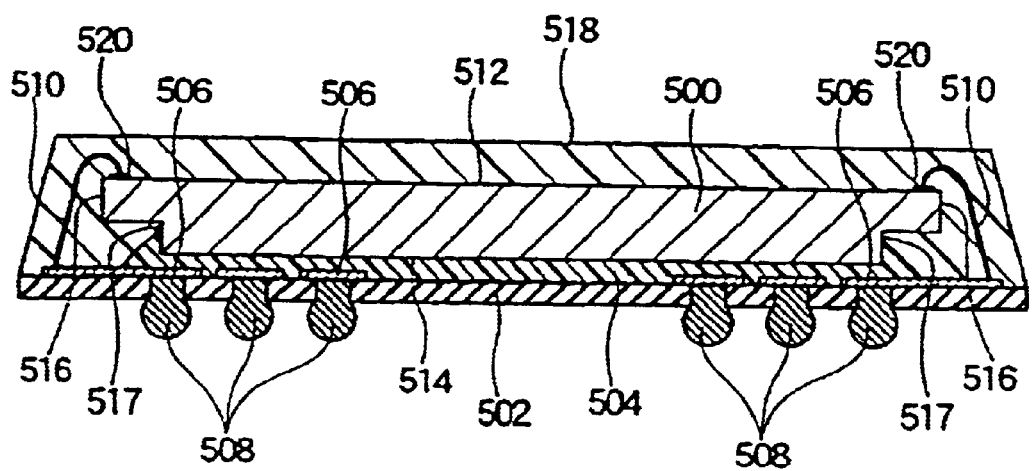
FIG. 5 is a cross-sectional side view illustrating the semiconductor package disclosed in the third embodiment of the present invention.

In the following, the third embodiment of the present invention will be explained. FIG. 5 shows the semiconductor device disclosed in the third embodiment. An integrated circuit (not shown in the figure) and electrode pads 520 are formed on the circuit surface 512 of semiconductor chip 500 in the same way as described in the first embodiment. Adhesion surface 514 is adhered to insulating substrate 502 via die paste 504. Also, semiconductor chip 500 is sealed with sealing material 518, and solder bumps 508 are formed on the bottom surface (side opposite to semiconductor chip 500) of insulating substrate 502. The adhesion surface 514 of semiconductor chip 500 is formed smaller than the circuit surface 512 in the same way as described in the first and second embodiments. However, the outer peripheral end surface of semiconductor chip 500 is formed as a vertical end surface with a two-step structure. The end surface 516 on the side of the circuit surface 512 is formed more protruding than the end surface 517 on the side of the adhesion surface 514. The material of each element is the same as that in the first embodiment.

FIG. 6 shows the method for manufacturing the semiconductor package disclosed in this embodiment. First, the integrated circuit is formed on the wafer surface 600 by following the regular wafer process. Then, as shown in FIG. 6(A), the wafer surface 600 where the integrated circuit is formed is bonded to a first sheet 602 made of a resin. After that, wafer 600 is cut as shown in FIG. 6(B). In a desired embodiment, a first blade 604 with a blade width of 400 $\mu$m and a vertical blade edge is used to dice wafer 600 from the side opposite to the first sheet 602. The dicing operation performed with the first blade 604, however, is stopped halfway in the thickness direction of wafer 600. Then, as shown in FIG. 6(C), a second blade 605 narrower than the first blade 604 is used to cut wafer 600 completely (individual semiconductor chip 500 are separated from each other). After the cut wafer 600 is washed, the first sheet 602 is irradiated with UV light in the same way as described in the first embodiment to remove the stickiness. Then, as shown in FIG. 6(D), a second sheet 606 made of another resin is adhered to the opposite side of wafer 600 against the first sheet 602. After that, as shown in FIG. 6(E), the first sheet 602 is peeled off from wafer 600 while wafer 600 is supported by the second sheet 606. After the second sheet 606 is irradiated with UV light to remove the stickiness, each semiconductor chip 500 is peeled off from the second sheet 606 as shown in FIG. 6(F). The semiconductor chip 500 is adhered to insulating substrate 502 with die paste 504 as shown in FIG. 5. Also, the electrode pads 620 of semiconductor chip 600 and the conductive leads 506 on insulating substrate 502 are connected to each other by means of wire bonding (using conductive wires 510). In this way, the semiconductor package shown in FIG. 5 is obtained.

In this embodiment, since the adhesion surface 514 of semiconductor chip 500 is also smaller than the circuit surface 512, even if the die paste spreads out around the adhesion surface 514, only a little will spread beyond the circuit surface 512. In this way, the wire bonding positions on conductive leads 506 can be set closer to semiconductor chip 500, and the semiconductor package can be further miniaturized.

In the following, embodiments 4–6, in which the present invention is applied to semiconductor package with a stack structure, that is, having semiconductor chips laminated in a package, will be explained.

Figure 7:
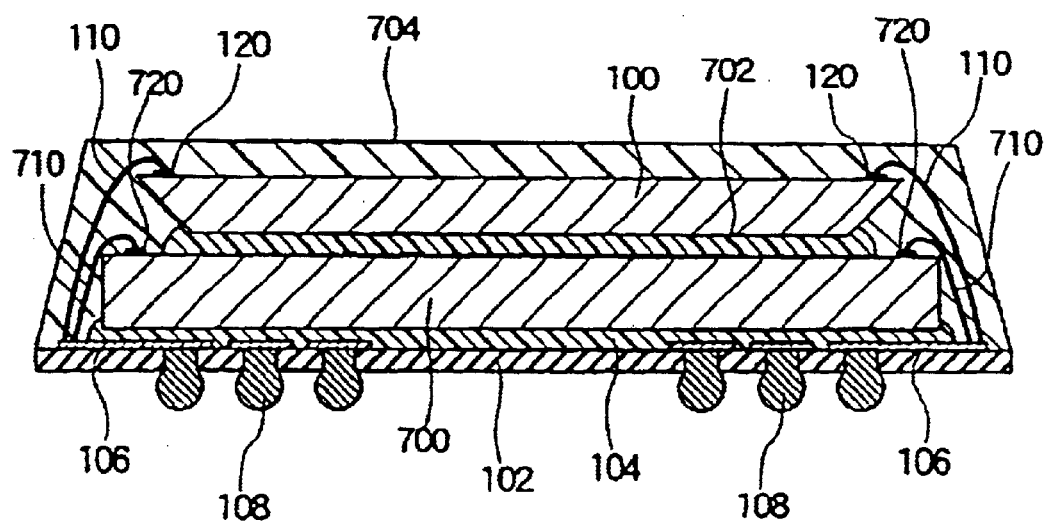
FIG. 7 is a cross-sectional side view illustrating the semiconductor package disclosed in the fourth embodiment of the present invention.
Figure 8A:
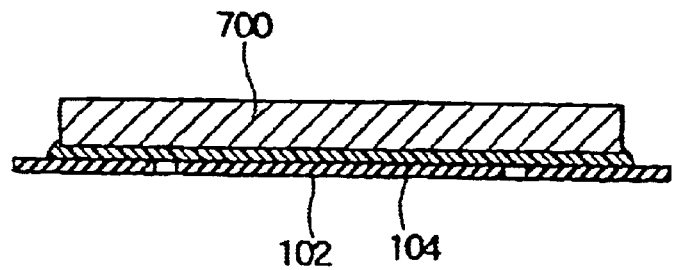
FIG. 8 is a diagram illustrating the process of manufacturing the semiconductor package shown in FIG. 7.
Figure 8B:
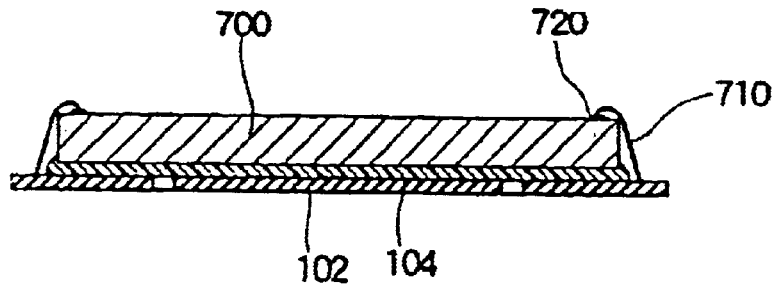
Figure 8C:
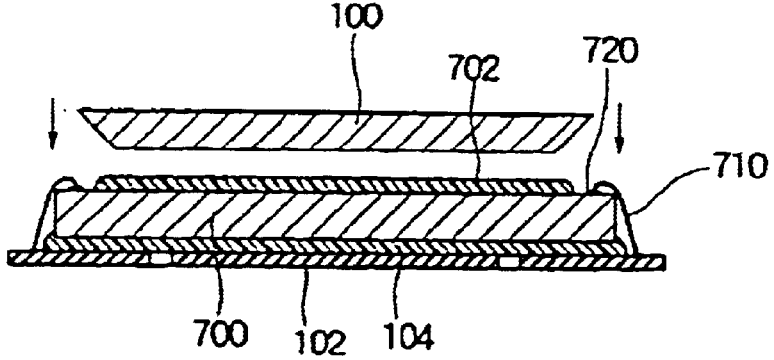
Figure 8D:
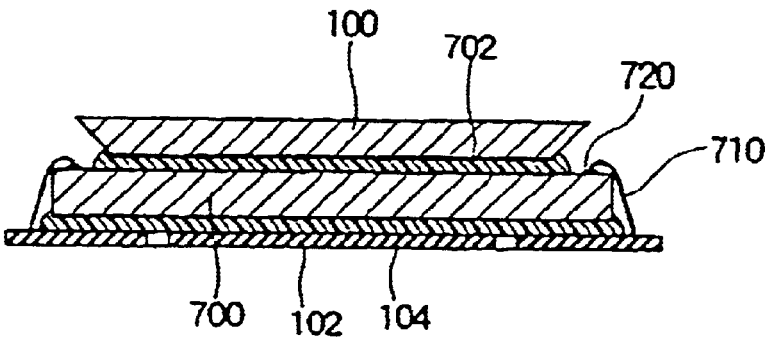
Figure 8E:
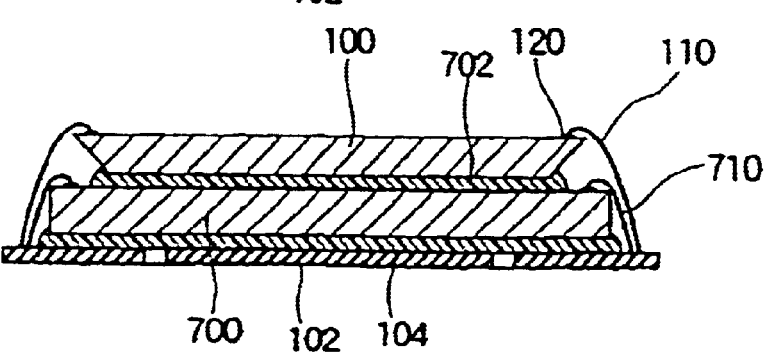

FIG. 7 is a cross-sectional view illustrating the semiconductor package with a stack structure disclosed in the fourth embodiment. In this semiconductor package, semiconductor chip 700 is fixed on insulating substrate 102 with die paste 104. Then, a semiconductor chip 100 with a tapered outer peripheral end surface explained in the first embodiment is fixed on the first semiconductor chip with die paste 702. Insulating substrate 102 and semiconductor chip 100 are the same as those used in the first embodiment (FIG. 1). Among the elements shown in FIG. 7, those that have been explained in FIG. 1 are represented with the same symbols, respectively. The explanation for those elements is omitted.

The semiconductor chip 700 used in this embodiment is different from semiconductor chip 100. It is a regular semiconductor chip with the top surface, that is, the circuit surface, and the bottom surface, that is, the adhesion surface, formed as the same size. On the circuit surface of semiconductor chip 700, electrode pads 720 are formed around the area where semiconductor chip 100 is to be mounted. These electrode pads 720 are connected to the conductive leads 106 on insulating substrate 102 with conductive wires 710. The electrode pads 120 on semiconductor chip 100 are connected to the conductive leads 106 on insulating substrate 102 with conductive wires 110. The taper of the end surface on the side of semiconductor chip 100 is preferred to be in the range of 30–60° like in the first embodiment. It, however, is particularly preferred to be about 45°. Both semiconductor chips 100 and 700 are sealed with sealing material 704.

FIG. 8 shows the method for manufacturing the semiconductor package of this embodiment. First, as shown in FIG. 8(A), semiconductor chip 700 manufactured separately is fixed on the top surface of insulating substrate 102 with die paste 104. Then, as shown in FIG. 8(B), the wire bonding method is used to connect the electrode pads 720 on semiconductor chip 700 to the conductive leads of insulating substrate 102. Then, as shown in FIG. 8(C), die paste 702 is provided onto the circuit surface of semiconductor chip 700. After that, as shown in FIG. 8(D), semiconductor chip 100 formed as shown in FIG. 2 is fixed on the die paste 702 on semiconductor chip 700 in such a way that the adhesion surface faces the side of semiconductor chip 700 (that is, the side of insulating substrate 102). Then, as shown in FIG. 8(E), the wire bonding method is used to connect the electrode pads 120 on semiconductor chip 100 to the conductive leads of insulating substrate 102 with conductive wires 110. After that, as shown in FIG. 7, semiconductor chips 100 and 700 are sealed with sealing material 704, followed by forming solder balls 708 on insulating substrate 102.

In this embodiment, since the adhesion surface of semiconductor chip 100 is smaller than the circuit surface, even if die paste 702 spreads out from the adhesion surface of semiconductor chip 100 to form a fillet, the amount of the paste spreading beyond semiconductor chip 100 can be reduced. Consequently, it becomes easy to guarantee the area for forming electrode pads 720 on the circuit surface of semiconductor chip 700.

In a desired embodiment, it is preferred to keep the fillet below the side end surface of semiconductor chip 100. In this case, for example, if the length of the fillet is about 0.2 mm, in the conventional technology, the outer peripheral end of semiconductor chip 700 must be extended beyond the outer peripheral end of semiconductor chip 100 by about 0.5 mm (that is, semiconductor chip 700 is made larger by that much). On the other hand, in the present embodiment, it is only necessary to lengthen the upper semiconductor chip beyond the lower semiconductor chip by about 0.3 mm. In this way, the size of the upper semiconductor chip 100 can be increased by 0.2 mm on each side (0.4 mm on both sides). The design restrictions can be reduced. On the other hand, the size of the lower semiconductor chip 700 can be decreased by 0.2 mm on each side 0.4 mm on both sides) so that the semiconductor package can be miniaturized.

The top of the wire bonding positions on insulating substrate 102 can also be covered by the side end surface of semiconductor chip 100 as long as conductive wires 710 do not touch the side end surface of semiconductor chip 100. Wire bonding is also possible in this structure if the process shown in FIG. 8 is adopted.

In this embodiment, only the stacked upper semiconductor chip 100 has a tapered outer peripheral end surface. The lower semiconductor chip 700, however, may have the same structure. In this case, similar to the first embodiment, the package can be further miniaturized since the amount of the fillet spread out on insulating substrate 102 can be reduced.

Figure 9:
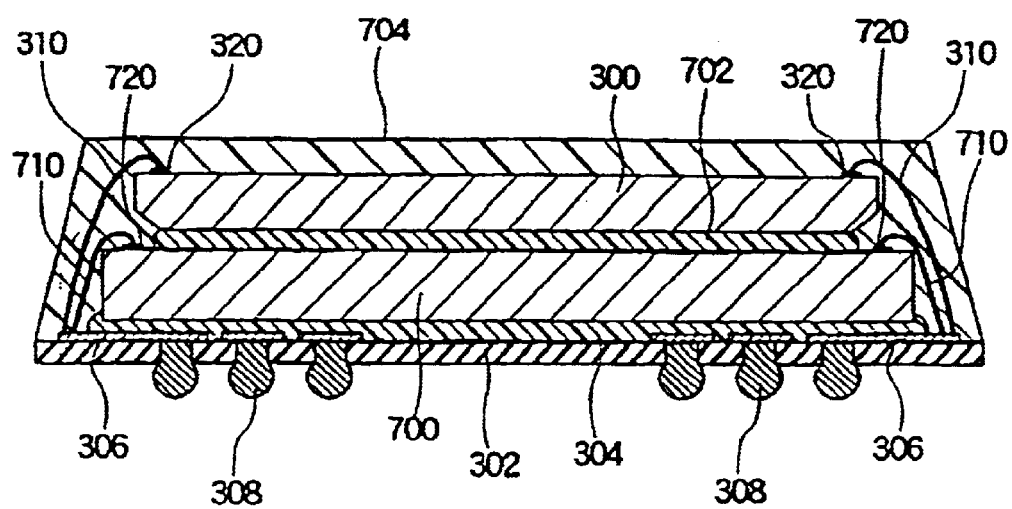
FIG. 9 is a cross-sectional side view illustrating the semiconductor package disclosed in the fifth embodiment of the present invention.
Figure 10A:
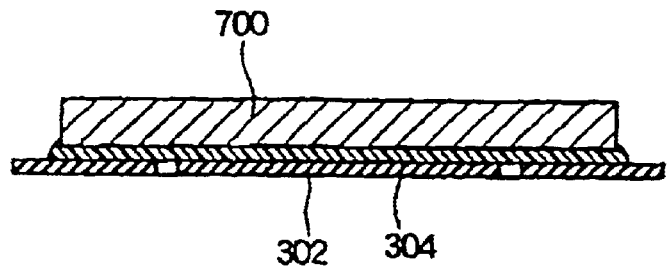
FIG. 10 is a diagram illustrating the process of manufacturing the semiconductor package shown in FIG. 9.
Figure 10B:
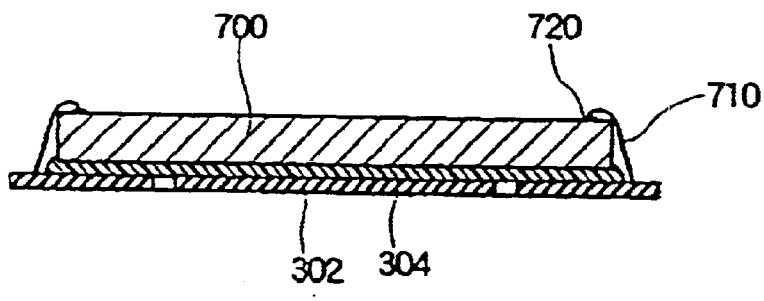
Figure 10C:
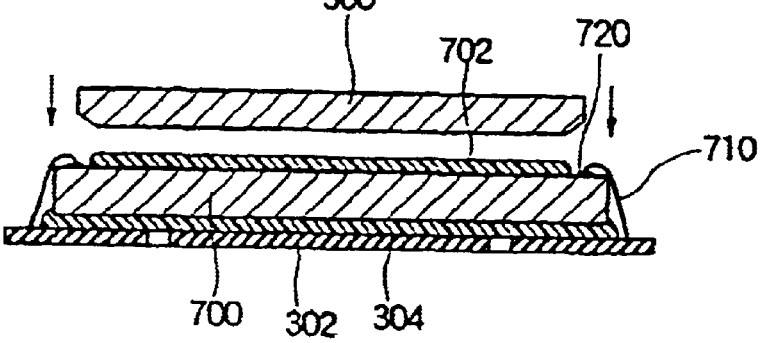
Figure 10D:
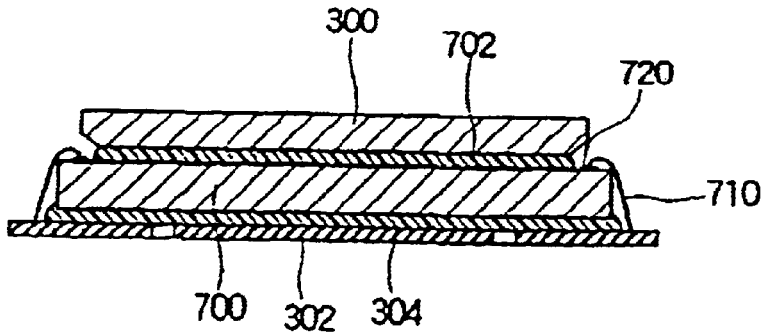
Figure 10E:
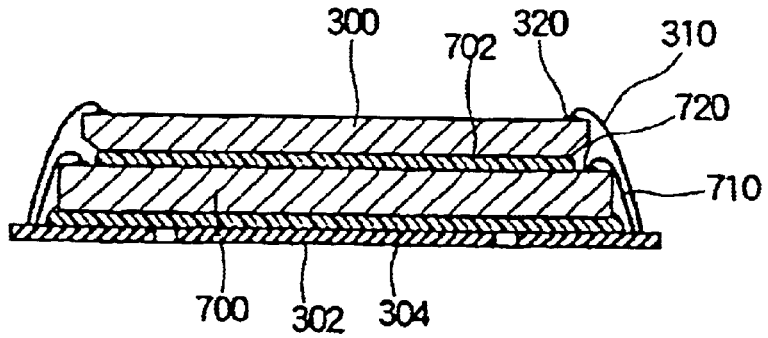

FIG. 9 is a cross-sectional view illustrating the semiconductor package disclosed in the fifth embodiment. In this semiconductor package, semiconductor chip 700 is fixed on an insulating substrate 302, and the semiconductor chip 300 explained in the second embodiment is fixed on semiconductor chip. Insulating substrate 302 and semiconductor chip 300 are the same as those used in the second embodiment (FIG. 3). Among the element shown in FIG. 9, those that haven been explained in FIGS. 3 and 7 are represented by the same symbols, respectively. Therefore, the explanation for these elements is omitted.

In this embodiment, semiconductor chip 700 is fixed on insulating substrate 302 via die paste 304, and semiconductor chip 300 is fixed on its circuit surface via die paste 702. The conductive leads 306 on insulating substrate 302 are connected to the electrode pads 720 on semiconductor chip 700 by conductive wires 710. The conductive leads 306 on insulating substrate 302 are connected to the electrode pads 320 on semiconductor chip 300 by conductive wires 310.

FIG. 10 shows the method for manufacturing semiconductor package disclosed in this embodiment. First, as shown in FIG. 10(A), semiconductor chip 700 is fixed on the top surface of insulating substrate 302 using die paste 304. Then, as shown in FIG. 10(B), the wire bonding method is used to connect the electrode pads 720 on semiconductor chip 700 to the conductive leads on insulating substrate 302 with conductive wires 710. After that, as shown in FIG. 10(C), die paste 702 is supplied onto the circuit surface of semiconductor chip 700. Then, as shown in FIG. 10(D), the semiconductor chip 300 formed as shown in FIG. 4 is fixed on the die paste 702 on semiconductor chip 700 in such a way that the adhesion surface faces the side of semiconductor chip 700 (that is, the side of insulating substrate 302). Then, as shown in FIG. 10(E), the wire bonding method is used to connect the electrode pads 320 on semiconductor chip 300 to the conductive leads of insulating substrate 302 with conductive wires 310. After that, as shown in FIG. 9, semiconductor chips 300 and 700 are sealed with sealing material 704, followed by forming solder balls 708 on insulating substrate 302.

In this embodiment, like the fourth embodiment, since the adhesion surface of semiconductor chip 300 is smaller than the circuit surface, even if die paste 702 spreads out from the adhesion surface of semiconductor chip 300 to form a fillet, the amount of the paste spreading beyond semiconductor chip 300 can be reduced. Consequently, it becomes easy to guarantee the area for formation of electrode pads 720 on the circuit surface of semiconductor chip 700. In this way, the semiconductor package with the stack structure can be miniaturized, and the design restrictions can be reduced.

Figure 11:
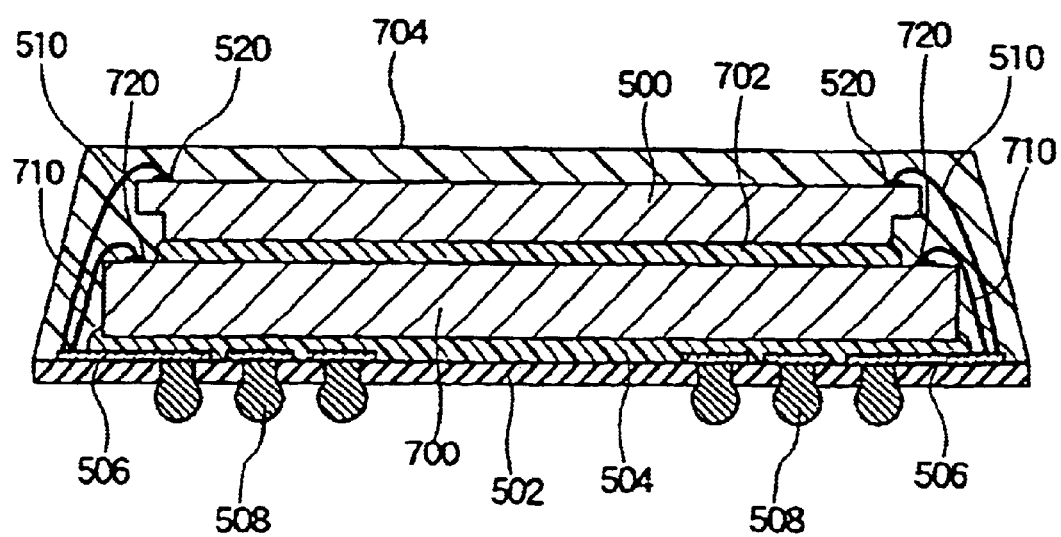
FIG. 11 is a cross-sectional side view illustrating the semiconductor package disclosed in the sixth embodiment of the present invention.
Figure 12A:
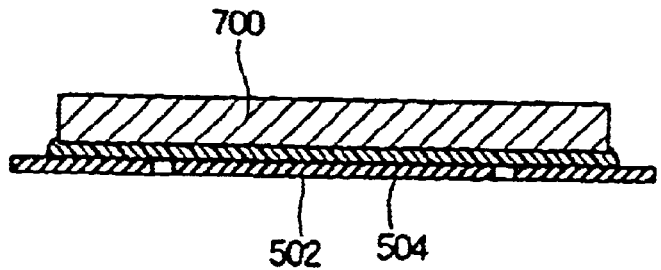
FIG. 12 is a diagram illustrating the process of manufacturing the semiconductor package shown in FIG. 11.
Figure 12B:
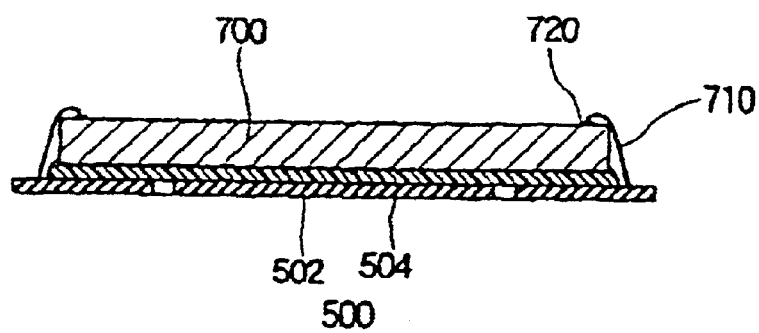
Figure 12C:
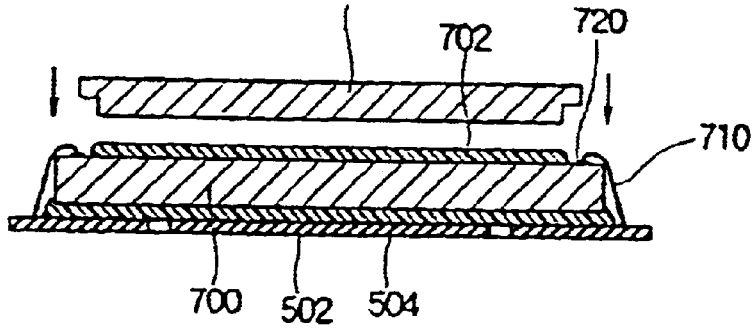
Figure 12D:
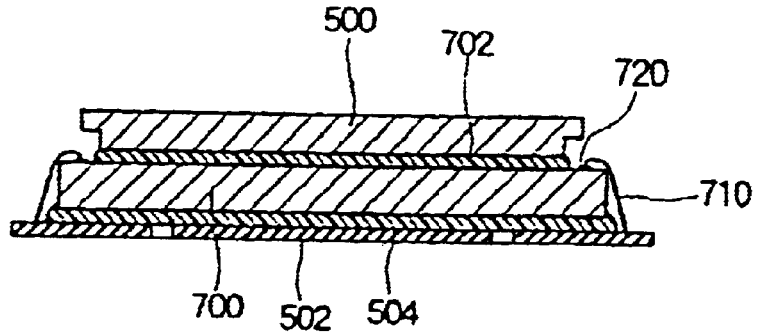
Figure 12E:
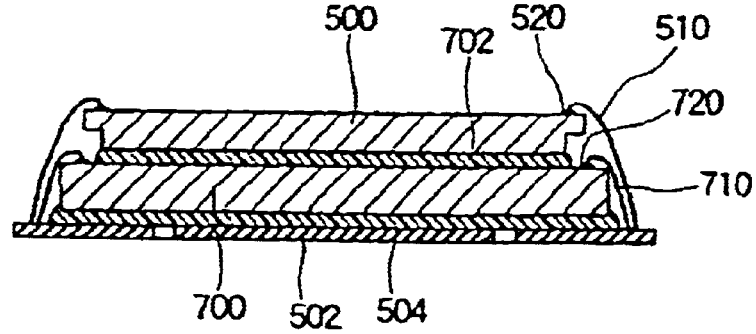

FIG. 11 is a cross-sectional view illustrating the semiconductor package disclosed in the sixth embodiment. In this semiconductor package, semiconductor chip 700 is fixed on insulating substrate 502, and semiconductor chip 500 explained in the third embodiment is fixed on the semiconductor chip. Insulating substrate 502 and semiconductor chip 500 are the same as those used in the second embodiment (FIG. 5). Among the elements shown in FIG. 9, those that have been explained in FIGS. 5 and 7 are represented by the same symbols, respectively. Therefore, the explanation for these elements is omitted.

In this embodiment, semiconductor chip 700 is fixed on insulating substrate 502 via die paste 504, and semiconductor chip 500 is fixed on its circuit surface via die paste 702. The conductive leads 506 on insulating substrate 502 are connected to the electrode pads 720 on semiconductor chip 700 by conductive wires 710. The conductive leads 506 on insulating substrate 502 are connected to the electrode pads 520 on semiconductor chip 500 by conductive wires 510.

FIG. 12 shows the method for manufacturing the semiconductor package disclosed in this embodiment. First, as shown in FIG. 12(A), semiconductor chip 700 is fixed on the top surface of insulating substrate 502 using die paste 504. Then, as shown in FIG. 12(B), the wire bonding method is used to connect the electrode pads 720 on semiconductor chip 700 to the conductive leads on insulating substrate 502 with conductive wires 710. After that, as shown in FIG. 12(C), die paste 702 is supplied onto the circuit surface of semiconductor chip 700. Then, as shown in FIG. 12(D), the semiconductor chip 500 formed as shown in FIG. 6 is fixed on the die paste 702 on semiconductor chip 700 in such a way that the adhesion surface faces the side of semiconductor chip 700 (that is, the side of insulating substrate 502). Then, as shown in FIG. 12(E), the wire bonding method is used to connect the electrode pads 520 on semiconductor chip 500 to the conductive leads of insulating substrate 502 with conductive wires 510. After that, as shown in FIG. 11, semiconductor chips 500 and 700 are sealed with sealing material 704, followed by forming solder balls 708 on insulating substrate 502.

In this embodiment, like the fourth and fifth embodiments, since the adhesion surface of semiconductor chip 500 is smaller than the circuit surface, even if die paste 702 spreads out from the adhesion surface of semiconductor chip 500 to form a fillet, the amount of the paste spreading beyond semiconductor chip 500 can be reduced. Consequently, it becomes easy to guarantee the area for formation of electrode pads 720 on the circuit surface of semiconductor chip 700. In this way, the semiconductor package with the stack structure can be miniaturized, and the design restrictions can be reduced.

In the above, the embodiments of the present invention have been explained with reference to the figures. The present invention, however, is not limited to these embodiments. Any modification, improvement, etc. can be made as long as they are within the range of the claims.

Figure 6A:
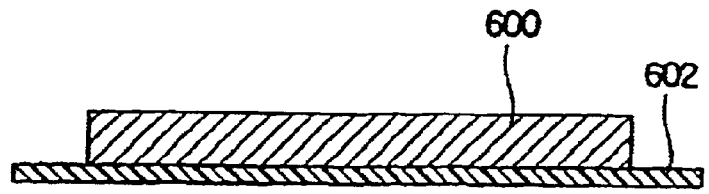
FIG. 6 is a diagram illustrating the process of manufacturing the semiconductor package shown in FIG. 5.
Figure 6B:
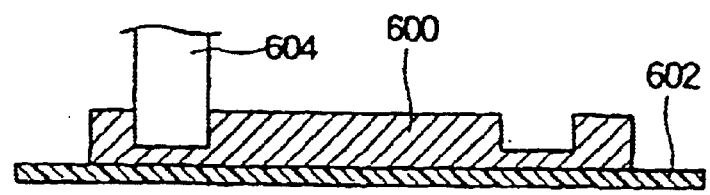
Figure 6C:
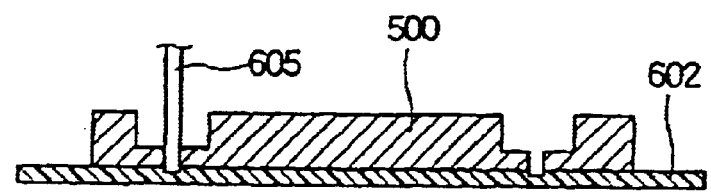
Figure 6D:
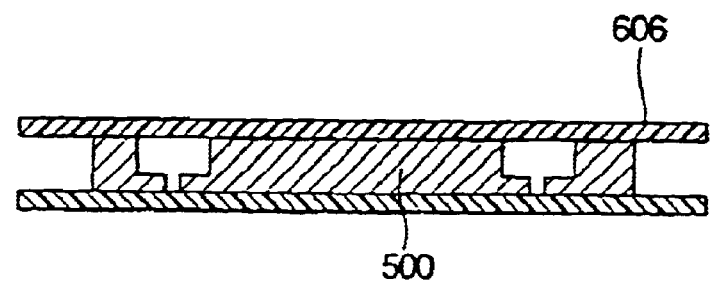
Figure 6E:
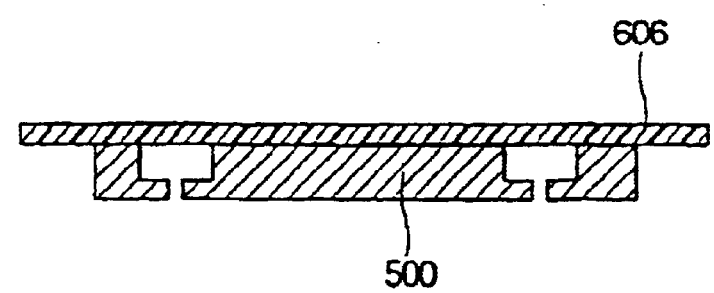
Figure 6F:
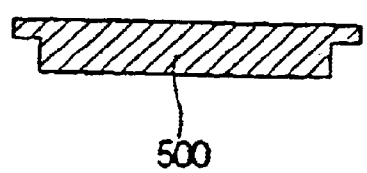
Figure 13A:
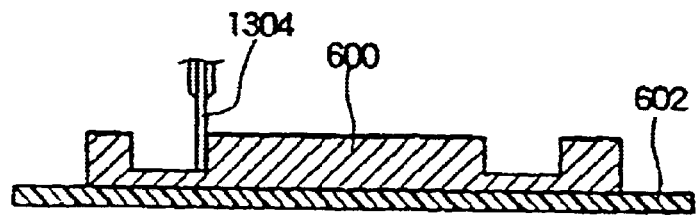
FIG. 13 is a cross-sectional view illustrating another example of the wafer dicing operation.
Figure 13B:
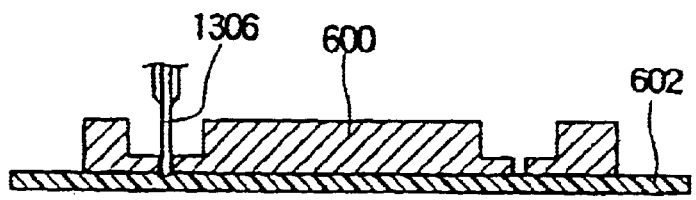
Figure 14:
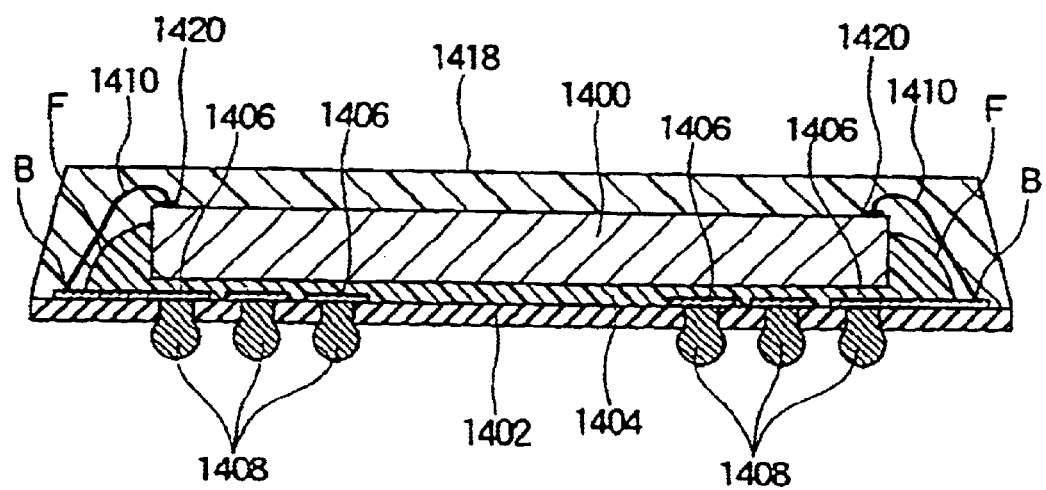
FIG. 14 is a cross-sectional view illustrating the structure of a conventional semiconductor package.

For example, in the third embodiment, in the dicing step of wafer 600 shown in FIGS. 6(B), (C), two types of blades 604 and 605 with different widths are used to form the end surface of the semiconductor chip into a two-step shape. It is also possible to use the method shown in FIG. 13. That is, as shown in FIGS. 13(A), (B), wafer 600 is diced with a narrow blade 1304. The blade 1304 is moved in the direction perpendicular to the dicing direction to form a wide groove. The central part of the groove is cut by blade 1306. In this way, the end surface of the semiconductor chip can be formed into a two-step shape. The steps thereafter are identical to those shown in FIGS. 6(D)–(F).

As described above, according to the present invention, the fillet spread out around the semiconductor chip can be eliminated or restrained to the minimum. In this way, the semiconductor package can be further miniaturized.

Also, when the present invention is adopted for a semiconductor package with the so-called stack structure, the plane size of the upper semiconductor chip can be maximized with respect to the lower semiconductor chip in the stack. As a result, the design restrictions can be reduced.

What is claimed is:

1. A semiconductor device comprising:
   an insulating substrate with a conductive lead formed on a top substrate surface thereof,
   a first semiconductor chip with a first bottom chip surface area being smaller than a first top chip surface area thereof, the first semiconductor chip having an electronic circuit and an electrode pad formed on a first top chip surface thereof and the first semiconductor chip being fixed via a first adhesive to the top substrate surface of the insulating substrate, wherein the first semiconductor chip has a first outer peripheral end located between the first top chip surface and a first bottom chip surface, the first outer peripheral end having a first step shape,
   a conductive wire that electrically connects the conductive lead of the insulating substrate to the electrode pad of the first semiconductor chip,
   a sealing material that is arranged on the insulating substrate to seal the first semiconductor chip and the conductive wire, and
   an electrode used for external connection and formed on a bottom substrate surface of the insulating substrate opposite to the top substrate surface.

2. The semiconductor device of claim 1 further comprising a second semiconductor chip fixed via a second adhesive to the first top chip surface of the first semiconductor chip.

3. The semiconductor device of claim 2, wherein the second semiconductor chip has a second bottom chip surface with a smaller area than that of a second top chip surface.

4. The semiconductor device of claim 2, wherein an outer peripheral end surface of the second semiconductor chip has a second stepped shape.

5. The semiconductor device of claim 3, wherein an outer peripheral end surface of the second semiconductor chip has a second stepped shape.

6. A semiconductor device manufacturing method comprising:
   forming an electronic circuit and an electrode pad on a top wafer surface of a wafer used as a semiconductor substrate;
   cutting the wafer in such a way that the top wafer surface is larger than a bottom wafer surface for each semiconductor chip, and wherein each semiconductor chip has an outer peripheral end with a stepped shape after the cutting;
   providing an adhesive on a top substrate surface of an insulating substrate having a conductive lead fanned on the top substrate surface;
   affixing a first semiconductor chip obtained as a result of the cutting of the wafer to the top substrate surface of the insulating substrate via the adhesive;
   connecting the conductive lead on the insulating substrate to the electrode pad of the first semiconductor chip with a conductive wire;
   providing a sealing material onto the insulating substrate to seal the first semiconductor chip.

7. The semiconductor device manufacturing method of claim 6, further comprising:
   affixing a second semiconductor chip to the first semiconductor chip.

8. A packaged semiconductor chip comprising:
   a substrate having a top substrate surface; and
   a first semiconductor chip attached to the top substrate surface of the substrate, the first semiconductor chip having a top chip surface with a top chip surface area, a bottom chip surface with a bottom chip surface area, and outer peripheral ends between the top chip surface and the bottom chip surface,
   wherein the bottom chip surface faces the top substrate surface,
   wherein the top chip surface area is larger than the bottom chip surface area, and
   wherein a first outer peripheral end of the outer peripheral ends has a first step shape.

9. The packaged semiconductor chip of claim 8, wherein a second outer peripheral end of the outer peripheral ends has a second step shape, wherein the second outer peripheral end faces an opposite direction relative to the first outer peripheral end.

10. The packaged semiconductor chip of claim 9, wherein third and fourth outer peripheral ends of the outer peripheral ends have a third and fourth step shape, respectively, wherein the fourth outer peripheral end faces an opposite direction relative to the third outer peripheral end and wherein the third and fourth outer peripheral ends are perpendicular to the first and second outer peripheral ends.

11. The packaged semiconductor chip of claim 8, further comprising a sealing material formed over the first semiconductor chip and on the top substrate surface.

12. The packaged semiconductor chip of claim 8, wherein the substrate comprises:
   leads formed on the top substrate surface; and
   a set of solder bumps extending from a bottom substrate surface, the solder bumps being electrically connected to the leads.

13. The packaged semiconductor chip of claim 12, wherein the first semiconductor chip comprises a set of electrode pads on the top chip surface, the set of electrode pads being electrically connected to the leads.

14. A packaged semiconductor chip comprising:
   a substrate having a top substrate surface;
   a first semiconductor chip having a first top chip surface with a first top chip surface area, a first bottom chip surface with a first bottom chip surface area, and outer peripheral ends between the first top chip surface and the first bottom chip surface, wherein the first top chip surface area is larger than the first bottom chip surface area, and wherein a first outer peripheral end of the outer peripheral ends has a first step shape; and a second semiconductor chip having a second top chip surface and a second bottom chip surface, the second bottom chip surface of the second semiconductor chip being attached to the top substrate surface by a first adhesive, and the first bottom chip surface of the first semiconductor chip being attached to the second top chip surface of the second semiconductor chip by a second adhesive.

15. The packaged semiconductor chip of claim 14, wherein a second outer peripheral end of the outer peripheral ends has a second step shape, wherein the second outer peripheral end faces an opposite direction relative to the first outer peripheral end.

16. The packaged semiconductor chip of claim 15, wherein third and fourth outer peripheral ends of the outer peripheral ends have a third and fourth step shape, respectively, wherein the fourth outer peripheral end faces an opposite direction relative to the third outer peripheral end and wherein the third and fourth outer peripheral ends are perpendicular to the first and second outer peripheral ends.

17. The packaged semiconductor chip of claim 14, further comprising a sealing material formed over the first and second semiconductor chips and on the top substrate surface.

18. The packaged semiconductor chip of claim 14,
wherein the substrate comprises leads formed on the top substrate surface, and a set of solder bumps extending from a bottom substrate surface, the solder bumps being electrically connected to the leads;
wherein the first semiconductor chip comprises a first set of electrode pads on the first top chip surface, the first set of electrode pads being electrically connected to a first set of the leads, and wherein the second semiconductor chip comprises a second set of electrode pads on the second top chip surface, the second set of electrode pads being electrically connected to a second set of the leads.

19. A packaged semiconductor chip comprising:
a substrate having a top substrate surface; and
a first semiconductor chip located over the top substrate surface and electrically connected to the substrate, the first semiconductor chip having a top chip surface with a top chip surface area, a bottom chip surface with a bottom chip surface area, and outer peripheral ends between the top chip surface and the bottom chip surface,
wherein the bottom chip surface faces towards the top substrate surface,
wherein the top chip surface area is larger than the bottom chip, surface area, and
wherein at least some of the outer peripheral ends have a step shape, the step shape in a first end surface and a second end surface, wherein the first end surface is substantially parallel with the second end surface, and wherein the first end surface is on a different plane than the second end surface.

20. The packaged semiconductor chip of claim 19, wherein the first and second end surfaces are perpendicular to the top chip surface.

21. The packaged semiconductor chip of claim 19, wherein the first semiconductor chip is attached to the substrate by an adhesive.

22. The packaged semiconductor chip of claim 19, further comprising a second semiconductor chip adhered to the substrate, the second semiconductor chip being located between the first semiconductor chip and the substrate, wherein the first semiconductor chip is adhered to the second semiconductor chip.

* * * * *